US006689629B2

(12) United States Patent
Tsujimura et al.

(10) Patent No.: US 6,689,629 B2
(45) Date of Patent: Feb. 10, 2004

(54) ARRAY SUBSTRATE FOR DISPLAY, METHOD OF MANUFACTURING ARRAY SUBSTRATE FOR DISPLAY AND DISPLAY DEVICE USING THE ARRAY SUBSTRATE

(75) Inventors: Takatoshi Tsujimura, Fujisawa (JP); Atsuya Makita, Sagamihara (JP); Toshiaki Arai, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 10/068,500

(22) Filed: Feb. 5, 2002

(65) Prior Publication Data
US 2002/0106843 A1 Aug. 8, 2002

(30) Foreign Application Priority Data
Feb. 6, 2001 (JP) ......................................... 2001-029587

(51) Int. Cl.[7] ............................................. H01L 21/00
(52) U.S. Cl. ........................ 438/25; 438/149; 438/73; 257/72; 257/748
(58) Field of Search ............................... 438/25, 22, 30, 438/149, 73; 257/72, 748

(56) References Cited

U.S. PATENT DOCUMENTS 5,285,301 A * 2/1994 Shirahashi et al. ............ 359/59
6,163,356 A * 12/2000 Song et al. .................. 349/152

* cited by examiner

Primary Examiner—Caridad Everhart
(74) Attorney, Agent, or Firm—Tiffany L. Townsend

(57) ABSTRACT

Disclosed is to provide an array substrate for display, a method of manufacturing the array substrate for display and a display device using the array substrate for display.

The present invention is an array substrate for display, which includes: a thin film transistor array formed on an insulating substrate 1; a plurality of wirings 23 and 24 arranged on the insulating substrate 1; connection pads 25 and 27 arranged on unilateral ends of the wirings 23 and 24 and respectively connected therewith; and pixel electrodes 22, wherein dummy conductive patterns 29 are arranged between the ends of the connection pads 25 and 27 and ends of the pixel electrodes 22.

16 Claims, 11 Drawing Sheets (a)

EXPOSURE / DEVELOPMENT (b)

ETCHING / STRIPPING (c)

(a)

(b)

ARRAY SUBSTRATE FOR DISPLAY, METHOD OF MANUFACTURING ARRAY SUBSTRATE FOR DISPLAY AND DISPLAY DEVICE USING THE ARRAY SUBSTRATE

BACKGROUND OF THE INVENTION

The present invention relates to an array substrate for display, a method of manufacturing the array substrate for display and a display device using the array substrate for display.

A display device using a thin film transistor (TFT) array has been frequently used owing to low power consumption and capability of downsizing the display device. The thin film transistor array is manufactured by forming thin film transistors, each being composed of electrodes such as a gate electrode, a source electrode and a drain electrode, wirings such as scan lines and signal lines connected with the above-mentioned electrodes, and pixel electrodes on an insulating substrate.

In recent years, a higher operating speed, a higher resolution and a larger size have been required for the display device described above in many cases. A high speed and a high density have been required for each constituent component of the array for display, which forms a display device. Particularly, in order to operate the thin film transistor array at a high speed, it is preferable to use low-resistance aluminum (Al) for the wirings such as the scan lines and the signal lines since delay in gate pulses can be reduced and a writing speed to the thin film transistor can be increased.

Incidentally, aluminum tends to be easily oxidized in spite of its low resistance. Therefore, in many cases, wiring using aluminum is constituted as a two-layer structure, in which aluminum is used as a lower conductive material, and a material harder to be oxidized than aluminum such as chromium, tantalum, titanium or molybdenum is used as an upper conductive material. FIG. 11 is a view schematically showing a state where wiring 2 is deposited on an insulating substrate 1. A lower conductive material film 2a is deposited on an insulating substrate 1 made of such as glass, and an upper conductive material film 2b is deposited on the lower conductive material film 2a. Each of these films 2a and 2b is patterned by, for example, a proper etching process so as to have tapered ends.

In order to form a tapered shape shown in FIG. 11, an etching rate for the upper conductive material is required to be increased. In order to form the tapered shape shown in FIG. 11, various methods have been proposed up to now. For example, in the gazette of Japanese Patent Laid-Open No. Hei 10 (1998)-90706, a method has been proposed, in which dummy connection pads are provided on sides opposite to scan line connection pads and signal line connection pads, respectively. According to this method, over etching due to an etchant that will be relatively increased by lowering wiring density at ends of the substrate is prevented. Thus, undercut of a lower conductive material 3 is prevented, and an interlayer short circuit is prevented by imparting a proper tapered shape to the wiring 2.

However, though this method enables evenness of etching at the ends of the thin film transistor array substrate to be improved, the method cannot effectively prevent the undercut of the signal lines in a region where the wiring density is apt to be lowered from ends of the pixel electrodes to the connection pads, for example, in a portion where drawing wiring is formed.

Moreover, in the gazette of Japanese Patent Laid-Open No. Hei 10 (1998)-240150, disclosed is a method of forming a tapered shape at an angle ranging from 20 degrees to 70 degrees on wiring constituted of two layers, in which a pad formed of aluminum and metal such as molybdenum formed on the aluminum is subjected to wet etching. According to this method, a specified tapered shape can be imparted to the wiring formed of a conductive film of a two-layer structure by the wet etching. However, the method never discloses a method of evenly etching a substrate region while maintaining a selection ratio thereof even in the substrate region where the wiring density is lowered.

FIGS. 12A and 12B are enlarged schematic views for explaining a patterning process using a conventionally used wet process in order to impart the above-described tapered shape to the wiring. As shown in FIG. 12A, the lower conductive material 3 and an upper conductive material 4 are deposited on the insulating substrate 1 by a method such as physical vapor deposition. FIG. 12A shows that a photoresist film 5 is coated on a film of the upper conductive material 4 and is patterned in a desired shape. The respective films are etched by an etchant such as a solution of phosphoric acid, nitric acid, acetic acid or mixtures thereof, and desired tapered shapes are formed thereon.

FIG. 12B is a view for explaining an electrochemical process generated as each film is being etched when the wiring constituted of the upper conductive material 4 and the lower conductive material 3 is subjected to wet etching. In FIG. 12B, an internal layer portion of the upper conductive material 4 coated with the photoresist film 5 is not dissolved. However, at the end of the photoresist film 5, the upper conductive material 4 is dissolved by the etchant. When the wiring is formed by the wet etching, the upper conductive material 4 protected by the photoresist film 5 is further dissolved in a lateral direction from the end of the photoresist film 5 to turn into positive ions, and electrons emitted as a result are supplied to the lower conductive material 3. Thus, the upper conductive material 4 serves as an anode. In this connection, the lower conductive material 3 comes to serve as a cathode. Accordingly, an electrochemical cell is formed. Here, when the etching rate for the upper conductive material 4 is increased to form a required tapered shape, the density of the electrons generated by dissolving the upper conductive material 4 and flowing to the lower conductive material 3 is increased accompanied with an increase of a dissolution rate of the upper conductive material 4. FIG. 12B schematically shows currents I flowing from the upper conductive material 4 to the lower conductive material 3.

As the etching rate is increased, the density of the current flowing to an area of the upper conductive material 4, which is exposed to the etchant, exceeds a current density causing passivity of the upper conductive material 4. In such a case, the upper conductive material 4 is passivated not to be dissolved by the etchant, and only the lower conductive material 3 is dissolved accompanied with the progress of the etching, resulting in the occurrence of the undercut. When such undercut occurs, the wiring, for example, the gate wiring cannot be sufficiently coated with an insulating film in some cases, thus causing inconvenience such as an interlayer short circuit, resulting in lowering a yield of the display device.

SUMMARY OF THE INVENTION

The present invention was made with the foregoing problems in mind. An object of the present invention is to provide an array substrate for display, a method of manufacturing an array substrate for display and a display device using the array substrate for display, which are capable of being etched at a sufficiently high etching rate and a sufficient selection ratio, eliminating undercut, and providing a large-sized and high-resolution display device.

The foregoing object of the present invention is achieved by providing the array substrate for display, the method of manufacturing an array substrate for display and the display device using the array substrate for display of the present invention.

Specifically, according to the present invention, provided is an array substrate for display, comprising: a thin film transistor array formed on an insulating substrate; a plurality of wirings arranged on the insulating substrate; connection pads arranged on unilateral ends of the wirings and respectively connected with the wirings; pixel electrodes, and dummy conductive patterns arranged between the ends of the connection pads and ends of the pixel electrodes. The dummy conductive patterns can occupy 30 area % or more. In the present invention, the dummy conductive patterns can be formed as any of land patterns and line-and-space patterns. In the present invention, the wirings are constituted of a lower conductive material and an upper conductive material, and the lower conductive material can be any one of aluminum and an aluminum alloy. In the present invention, the upper conductive material has a passivating potential. The upper conductive material can be any one of molybdenum and a molybdenum alloy.

According to the present invention, provided is a method of manufacturing an array substrate for display, the method comprising the steps of: forming a thin film transistor array including: a plurality of wirings arranged on an insulating substrate; and connection pads arranged on unilateral ends of the wirings and respectively connected with the wirings; forming pixel electrodes; and forming dummy conductive patterns between ends of the connection pads and ends of the pixel electrodes. In the present invention, it is preferable that the dummy conductive patterns be formed so as to occupy 30 area % or more. In the present invention, the dummy conductive patterns can be formed as any of land patterns and line-and-space patterns. In the present invention, the wirings are constituted of a lower conductive material and an upper conductive material, the lower conductive material can be any one of aluminum and an aluminum alloy, and the upper conductive material can be any one of molybdenum and a molybdenum alloy. In the present invention, the wirings are formed by wet etching.

Moreover, in the present invention, provided is a display device, comprising the array substrate for display mentioned above.

In the present invention, the display device used as a liquid crystal display device or an electroluminescence display device can be provided.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

Figure 1:
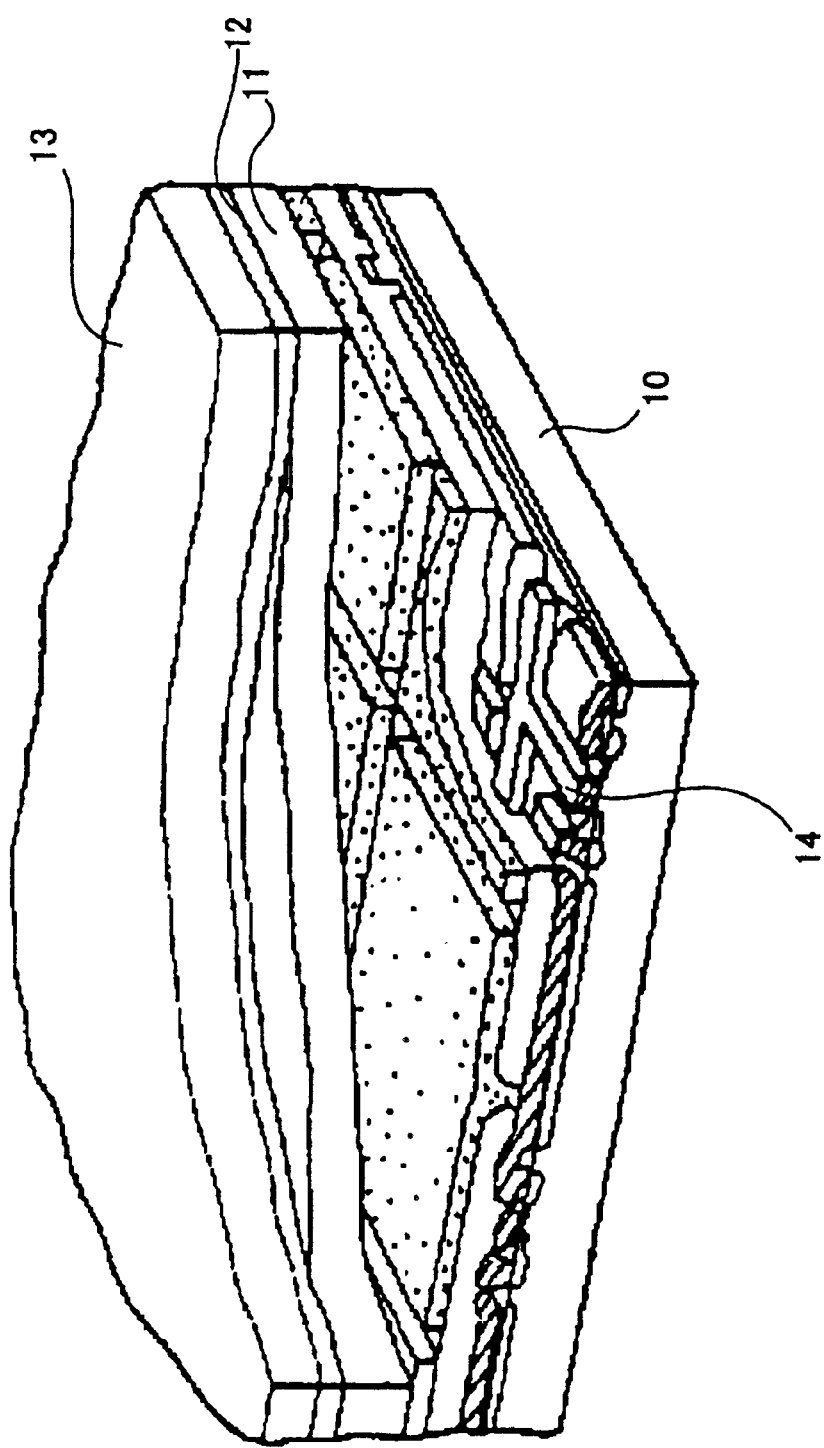
FIG. 1 is a view showing an embodiment of a liquid crystal display device using an array substrate for display of the present invention.

Hereinbelow, description will be made in detail for the present invention with reference to embodiments shown in the accompanying drawings. However, the present invention is not limited to the embodiments shown in the drawings.

FIG. 1 is a partially cutaway perspective view showing an embodiment of a display device using an array substrate for display of the present invention. As shown in FIG. 1, the display device of the present invention is constituted by sequentially laminating a liquid crystal layer 11, a transparent electrode 12 and a glass substrate 13 on an array substrate 10 for display, which is formed on an insulating substrate. Wiring 14 formed on the insulating substrate 10 is extended to an end (not shown) of the array substrate for display, and is connected with a driving system (not shown) through a connection pad (not shown).

Figure 2:
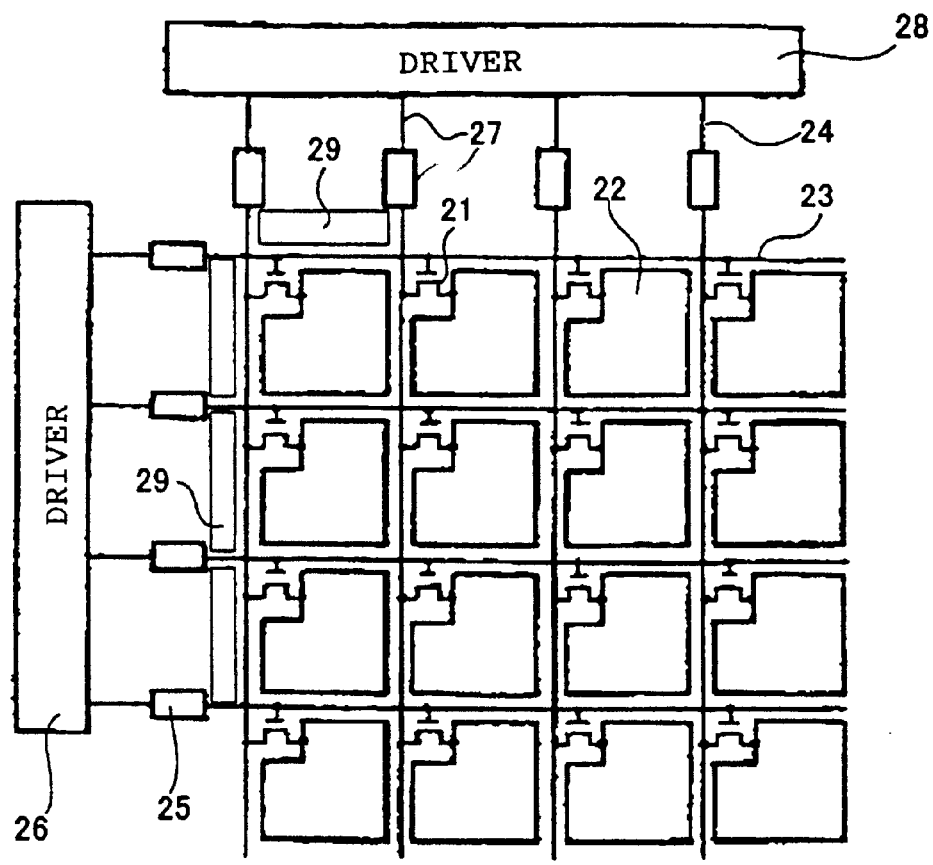
FIG. 2 is a top plan view of the array substrate for display of the present invention.

FIG. 2 is a top plan view of the display device using the array substrate 10 for display of the present invention, which is shown in FIG. 1. In the array substrate 10 for display of the present invention, a plurality of thin film transistors 21 constitute an array. A pixel electrode 22 is connected with each thin film transistor 21 that controls a potential of the pixel electrode. In the array substrate 10 for display shown in FIG. 2, what is further shown is that a scan line 23 and a signal line 24 are connected with each thin film transistor 21.

Figure 11:
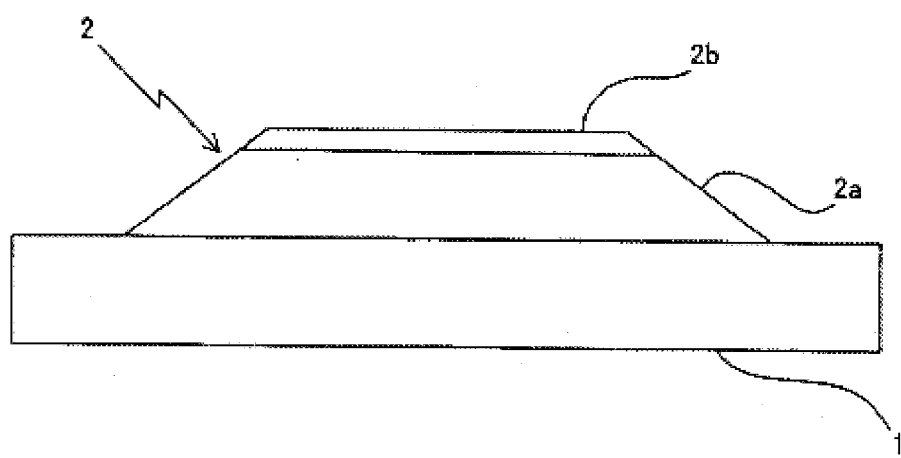
FIG. 11 is a schematic view showing a tapered shape of the wiring.
Figure 12:
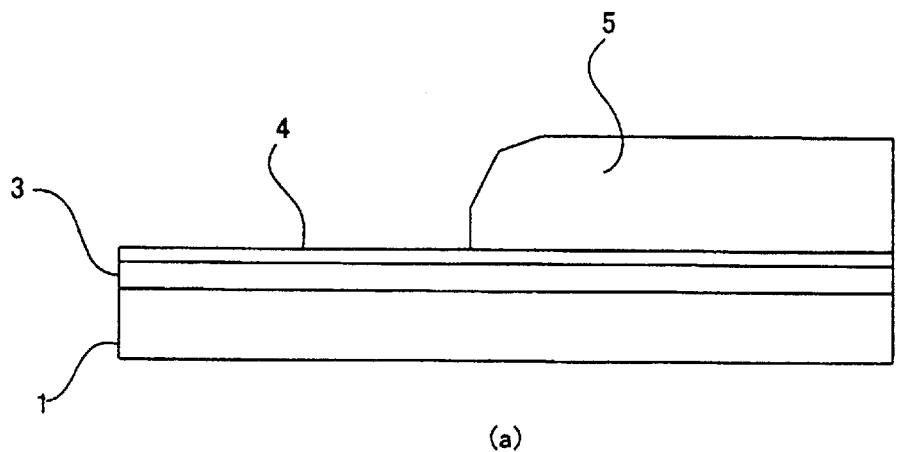
FIGS. 12A and 12B are views showing currents formed by a cell formed during an etching process.
Figure 12:
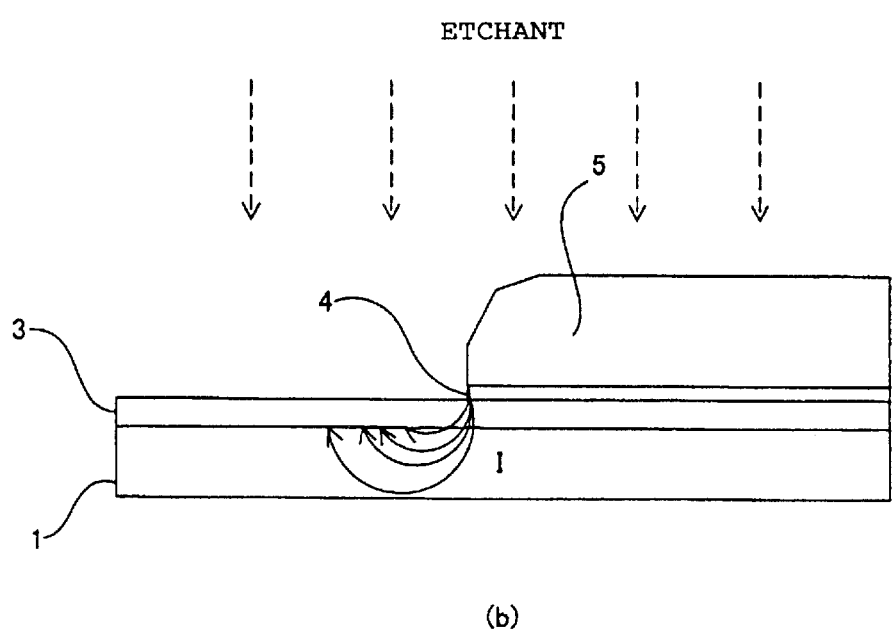

The respective scan lines 23 are connected with a driver 26 through scan line connection pads 25, and the respective signal lines 24 are connected with a driver 28 through signal line connection pads 27. These scan lines 23 and the signal lines 24 are formed so as to have the same constitution. As shown in FIG. 11, each of these lines is constituted of the lower conductive material 3 and the upper conductive material 4.

In the present invention, aluminum can be used for the lower conductive material 3 usable as wiring from a viewpoint of lowering resistance thereof. Moreover, it is preferable to use molybdenum (Mo) for the upper conductive material 4 usable in the present invention from a viewpoint of protecting the aluminum. However in the present invention, besides the aluminum, an aluminum alloy can be used for the lower conductive material 3. Moreover, for the upper conductive material 4, alloys of chromium, tantalum, titanium and molybdenum can be used. Film thickness of the lower conductive material 3 is not particularly limited, but film thickness of the upper conductive material 4 is preferably thick since a current tends to be concentrated thereto as the film thickness becomes thinner. However, a problem regarding stress occurs as the thickness becomes thicker. Therefore, in the present invention, it is preferable to set the film thickness of the upper conductive material 4 in a range of 30 to 100 nm.

The present invention makes it possible to prevent undercut of the lower conductive material 3, which occurs due to passivity of the upper conductive material 4. In the present invention, the term "passivity" is referred to as a phenomenon that metal such as molybdenum or a metal alloy such as a molybdenum alloy becomes insoluble in an acid or alkaline etchant. For example, the term "passivity" is referred to as a phenomenon that metal serving as an anode becomes insoluble in such etchant. In the present invention, specifically as for such passivated metal or a metal alloy, metal or a metal alloy with a passivating potential, that is, a Flade potential can be mentioned. Note that, in the present invention, the Flade potential is referred to as a potential which causes a current density for passivating metal, which is described in the Encyclopedia Chimica (miniature edition $32^{nd}$ printing, issued by Kyoritsu Shuppan Co., Ltd., edited by editorial committee of the Encyclopedia Chimica), vol. 7, p. 911.

Furthermore, in the embodiment shown in FIG. 2, dummy conductive patterns 29 are disposed between the pixel electrodes 22 and each scan line connection pad 25 and between the pixel electrodes 22 and each signal line connection pad 27. Thus, the wiring density is increased. Therefore, it is made possible to form good wiring over the entire surface of the array substrate for display without causing defects such as undercut and a mouse hole of the lower conductive material 3 during etching for the scan lines 23 and the signal lines 24. Each of these dummy conductive patterns 29 can be formed as a two-layers structure with the same materials as those of the scan lines 23 and the signal lines 24 at the same time when the patterning is performed therefor.

Figure 3:
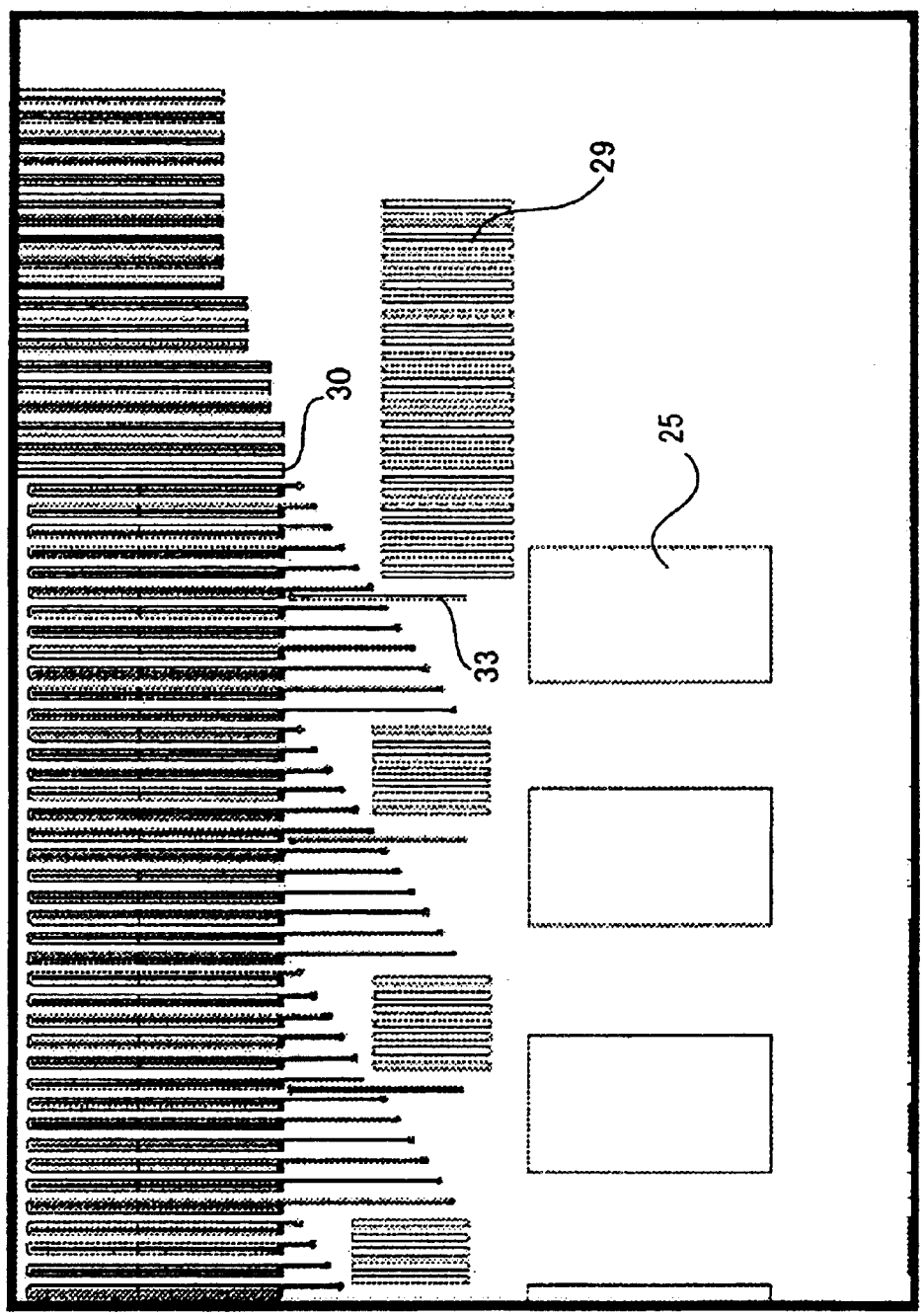
FIG. 3 is an enlarged view showing a dummy conductive pattern in the present invention.

FIG. 3 is an enlarged view showing a portion where the dummy conductive pattern 29 is formed in the embodiment of the array substrate 10 for display of the present invention shown in FIG. 2. FIG. 3 shows the dummy conductive pattern 29 formed as a line-and-space pattern between the connection pad 25 and an end 30 of the pixel electrode. In the present invention, the dummy conductive pattern 29 can be formed as the line-and-space pattern shown in FIG. 3. Alternatively, the dummy conductive pattern 29 can be formed as a land pattern completely coating a region where the dummy conductive pattern 29 is formed.

In any case of the patterns, in the present invention, it is preferable that the wiring density of the dummy conductive patterns 29 themselves be 30% or more on an area of a specified surface from a viewpoint of forming a properly tapered shape on the lower conductive material 3 without forming the undercut thereto while dissolving the upper conductive material 4 at a required rate.

Moreover, when the dummy conductive patterns 29 are arranged in the present invention, it is more preferable that the dummy conductive patterns 29 be formed between the end 30 of the pixel electrode 22 and each connection pads 25 and 27 so that the wiring density including the dummy conductive patterns 29 can be 30% or more on the area of a specified surface. In the present invention, the term "wiring density" refers to an area ratio of an area of portions where the signal lines, the scan lines, the drawing lines, and the dummy conductive patterns are formed on an area of a specified region where the dummy conductive patterns are formed.

Figure 4:
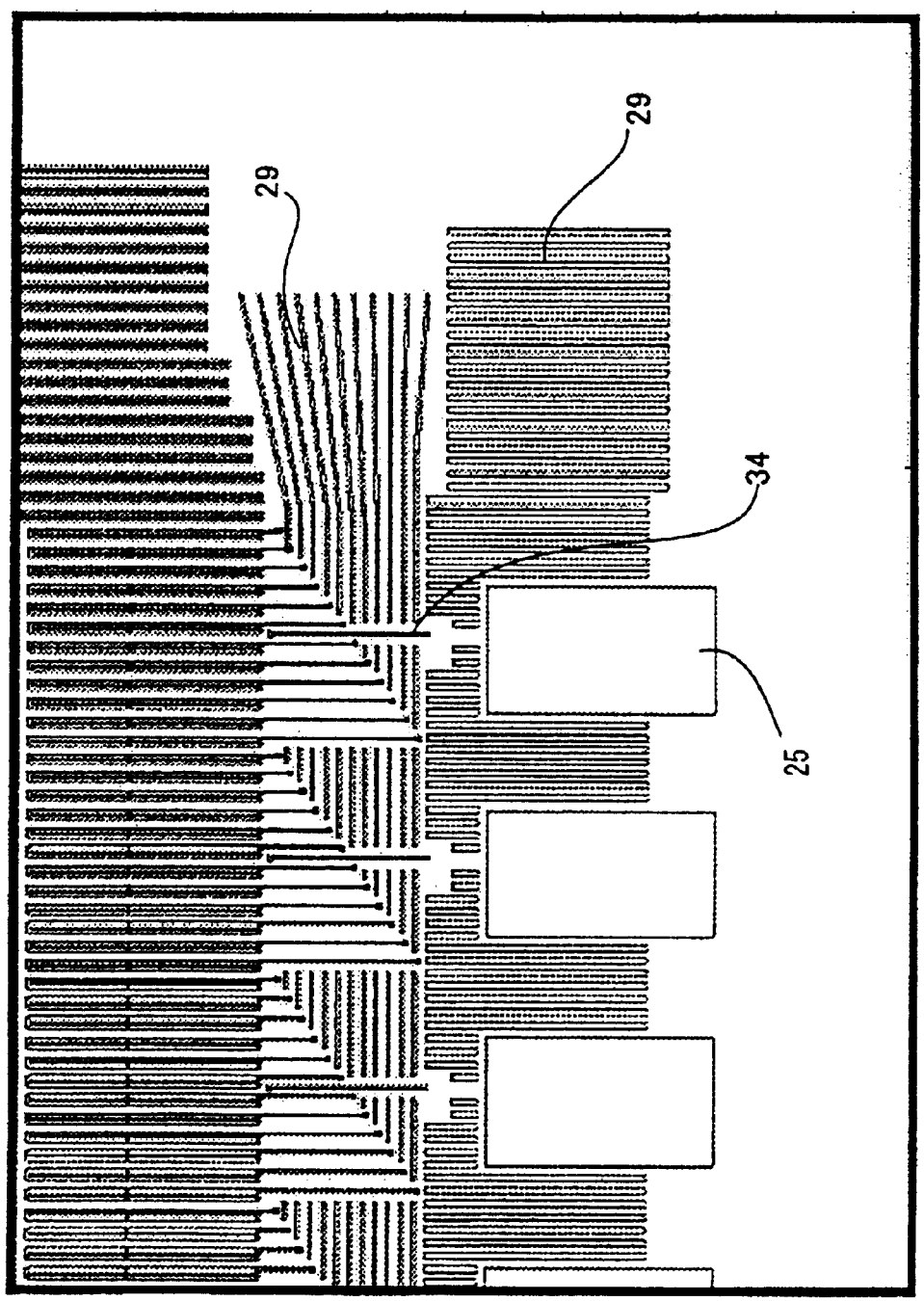
FIG. 4 is an enlarged view showing another dummy conductive pattern in the present invention.

FIG. 4 is a view showing another embodiment of the dummy conductive pattern 29 of the present invention. In the embodiment shown in FIG. 4, the dummy conductive pattern 29 is disposed so that the wiring density thereof, which is specified at 30% or more, is further increased, thus reducing concentration of electric current to exposed portions of the upper conductive material to the etchant during the etching. As shown in FIG. 4, the dummy conductive pattern 29 may have any shapes and any patterns. Moreover, any combination of a plural type of the dummy conductive patterns 29 can be used.

Figure 5:
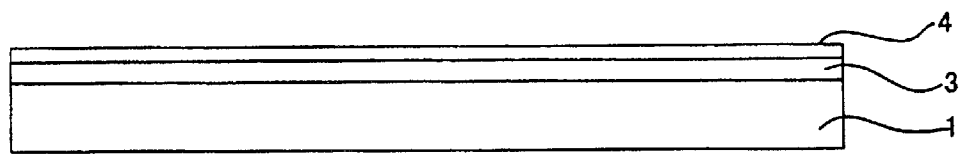
FIGS. 5A to 5C are views illustrating a method of manufacturing the array substrate for display of the present invention.
Figure 5:
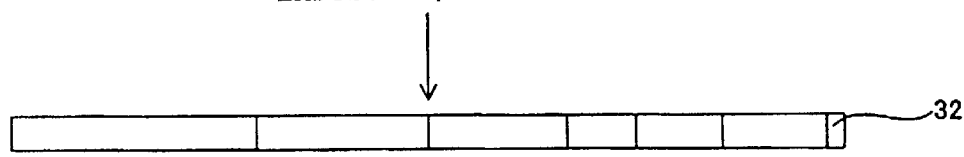
Figure 5:
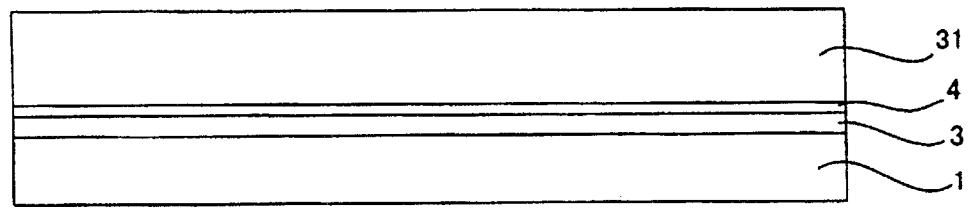
Figure 5:
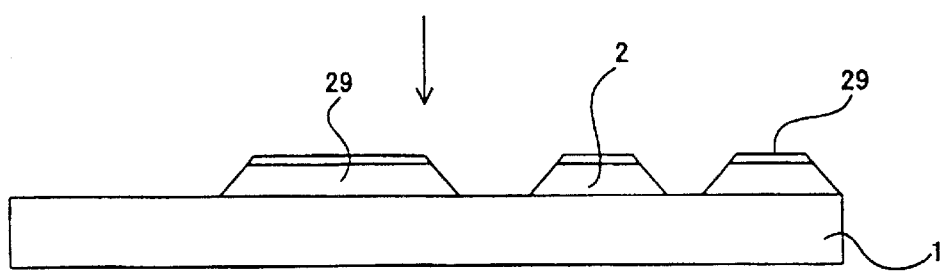

FIGS. 5A, 5B and 5C are views showing an embodiment of a method of manufacturing the array substrate 10 for display of the present invention. With reference to FIG. 5, description will be made for the method of manufacturing the array substrate 10 for display of the present invention, exemplifying a case where the thin film transistor 21 of a reverse stagger type is formed. First, as shown in FIG. 5A, the lower conductive material 3 using aluminum and the upper conductive material 4 using molybdenum are deposited on the transparent or untransparent insulating substrate 1, thus forming a film.

Next, as shown in FIG. 5B, photoresist 31 is coated on the film. The photoresist is exposed and developed by use of a photo mask 32 provided with patterns for forming the dummy conductive patterns 29 in portions where the wiring density is lowered between the pixel electrodes and the connection pads, which are not particularly shown.

Subsequently, etching is performed by use of an etchant such as a solution of phosphoric acid, nitric acid, acetic acid and mixtures thereof, thus forming the wiring 2 and the dummy conductive patterns 29. The dummy conductive patterns 29 are arranged in the portions where the wiring density is low. Thus, it is made possible to form wirings having good tapered shape as shown in FIG. 5C even in regions where the conductive material such as molybdenum tends to be passivated. A taper angle can be set in a range of 20 degrees to 70 degrees by adjusting a composition of the etchant and etching conditions. It is more preferable to set the taper angle in a range of about 20 degrees to about 60 degrees.

Thereafter, in the present invention, gate insulating films, the gate electrodes, the source electrodes, the drain electrodes, the pixel electrodes and the like are formed, thus the array substrate 10 for display of the present invention is manufactured. In the present invention, the dummy conductive patterns 29 may be removed if necessary. Alternatively, the dummy conductive patterns 29 may be left as they are without being eliminated.

Figure 6:
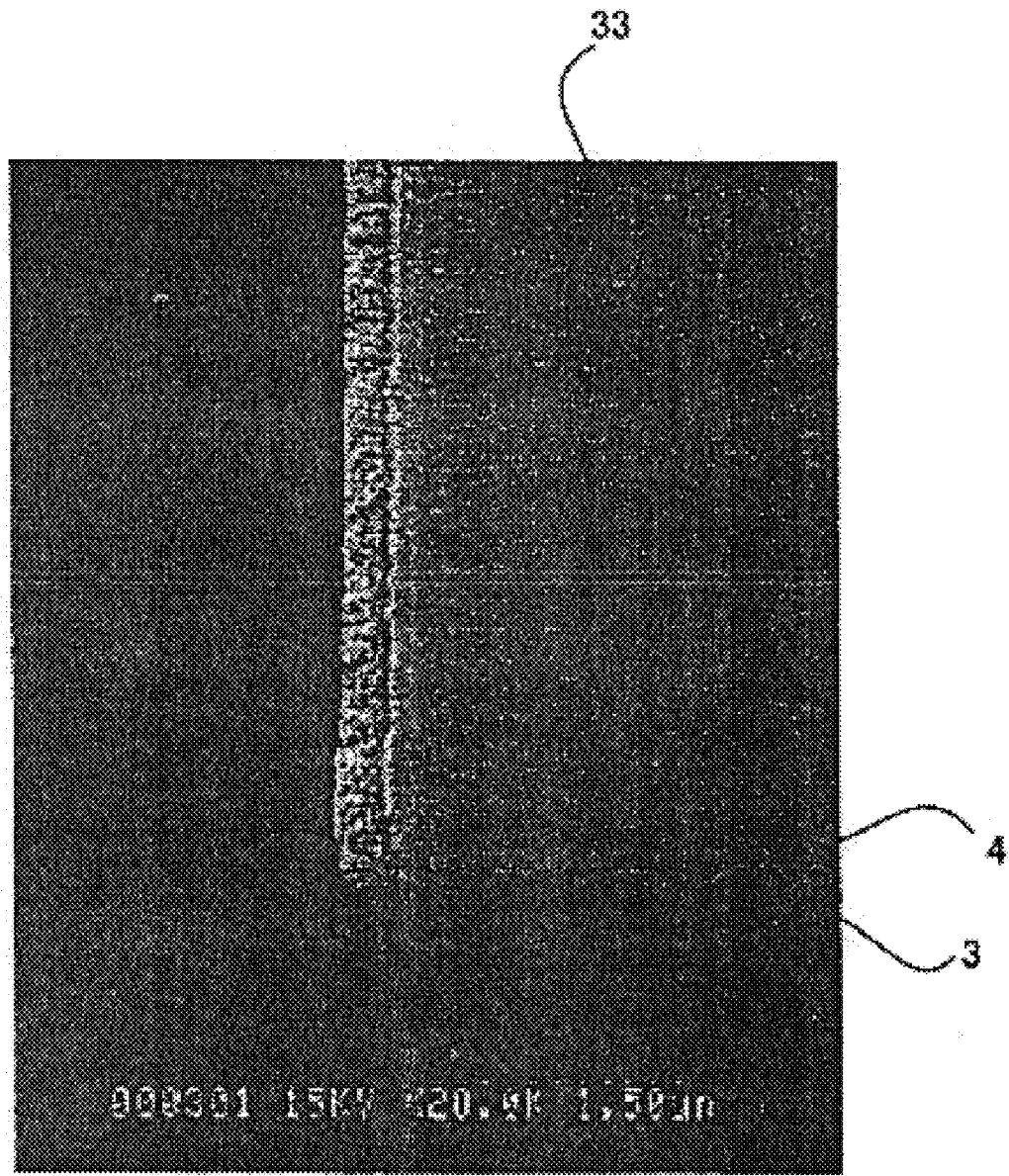
FIG. 6 is an electron microscope photograph showing a pattern shape of wiring in the case of using the dummy conductive pattern shown in FIG. 3.

FIG. 6 is an electron microscope photograph showing a shape of the wiring 33 shown in FIG. 3, which was obtained when the dummy conductive pattern 29 shown in FIG. 3 was provided and the etching was performed. In this case, molybdenum was used for the upper conductive material 4, and aluminum was used for the lower conductive material 3. The film thickness of molybdenum is about 50 nm, and wet etching is performed by use of an etchant of a mixed solution of phosphoric acid, nitric acid and acetic acid. As shown in FIG. 6, a good tapered shape is formed even in a wiring portion where the undercut is formerly apt to occur by forming the dummy conductive pattern 29.

Figure 7:
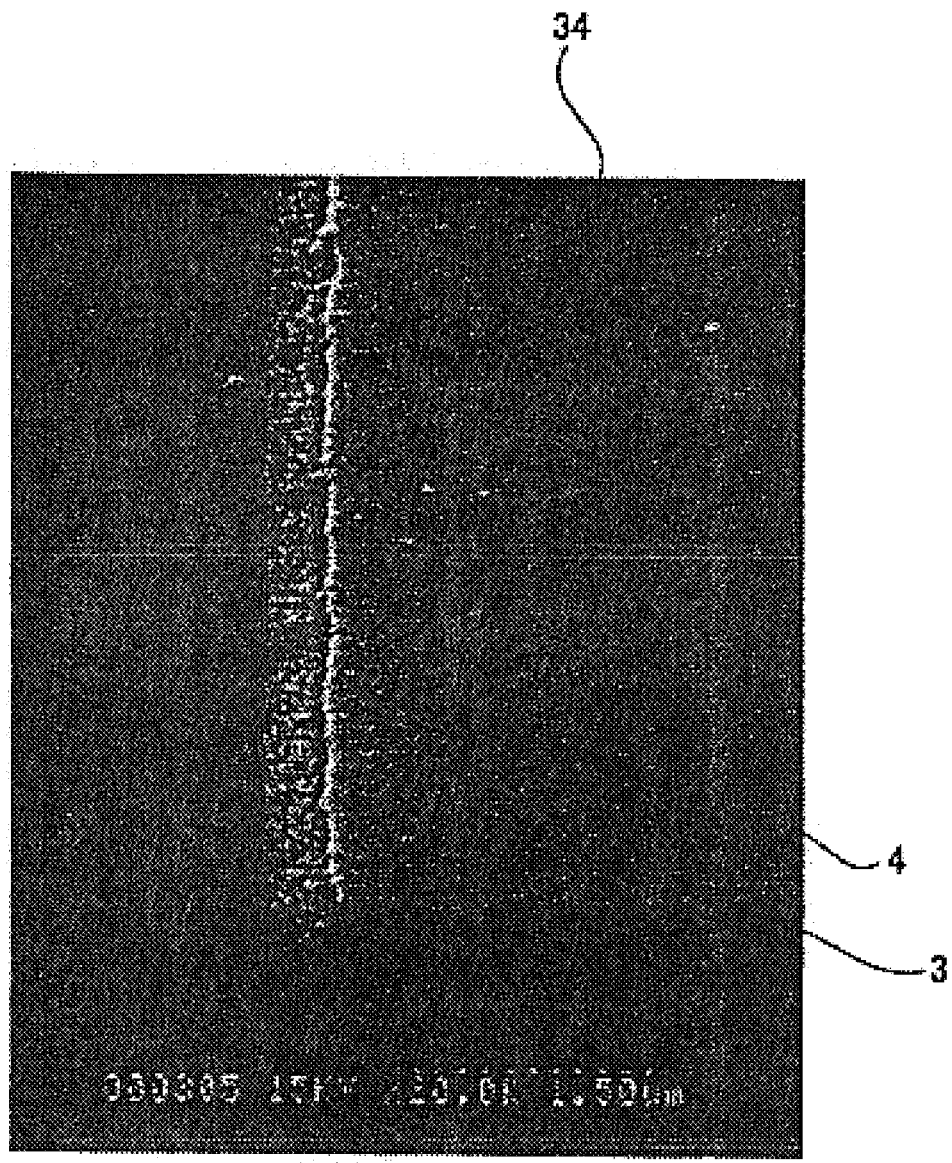
FIG. 7 is an electron microscope photograph showing a pattern shape of wiring in the case of using the dummy conductive pattern shown in FIG. 4.

FIG. 7 is a photograph showing a shape of the wiring 34 shown in FIG. 4, which was obtained when the dummy conductive pattern 29 shown in FIG. 4 was formed and the etching was performed under the same conditions as those in FIG. 6. As shown in FIG. 7, even when the density of the dummy conductive pattern 29 is increased, a good tapered shape is obtained.

Figure 8:
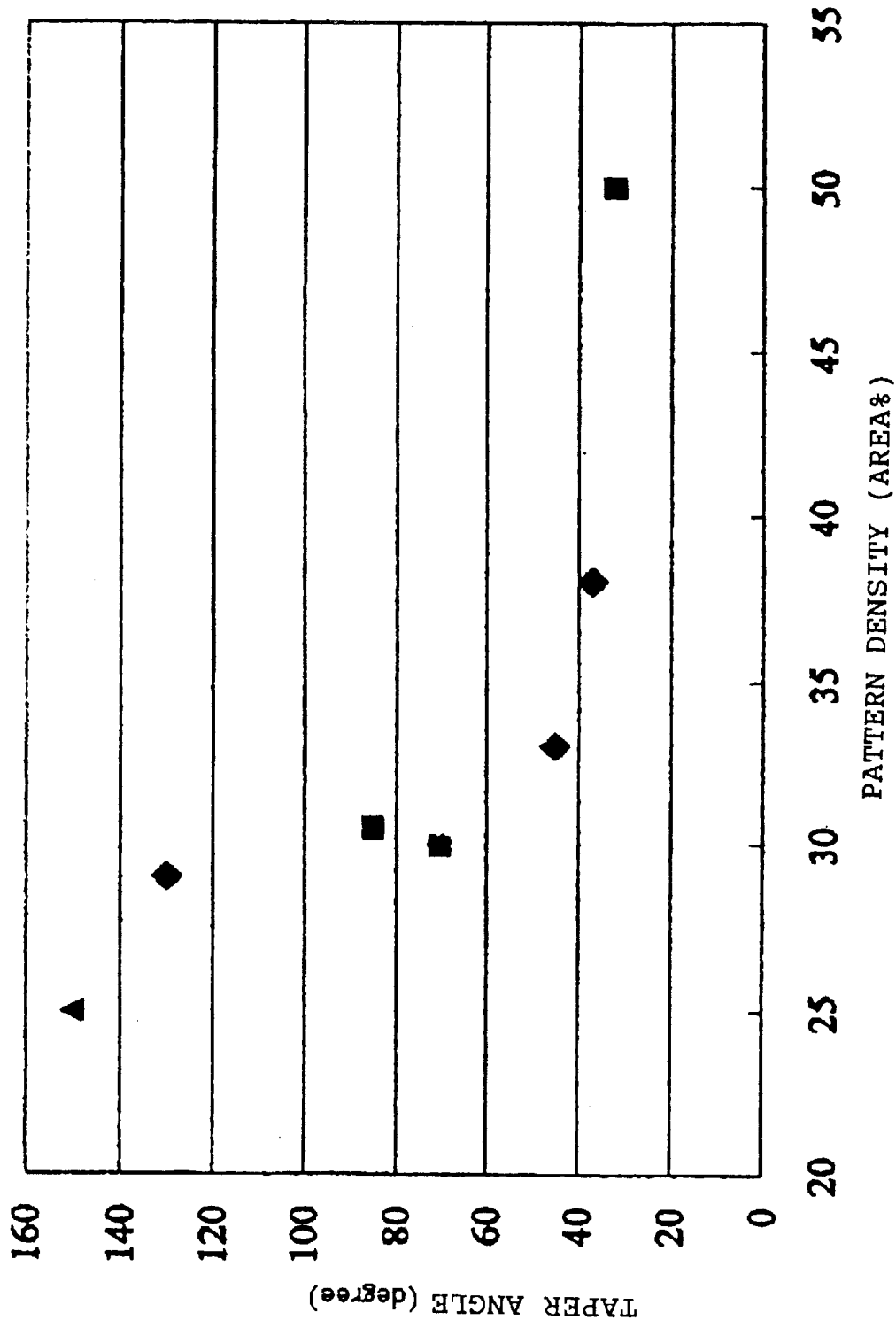
FIG. 8 is a graph showing a relation between a taper angle of the wiring and a pattern density of the wiring.

FIG. 8 is a graph plotting values of the taper angle of the formed wiring relative to values of the pattern density (area %) of the wiring including the portions of the dummy conductive patterns 29 on the substrate when the dummy conductive patterns 29 are arranged. As shown in FIG. 8, the taper angle of the wiring obtained by the etching is reduced as the pattern density of the wiring is increased, and a more gentle taper is formed. Therefore, it is understood that the upper conductive material 4 can impart a sufficient selective ratio to the etching of the lower conductive material 3 by arranging the dummy conductive patterns 29.

Figure 9:
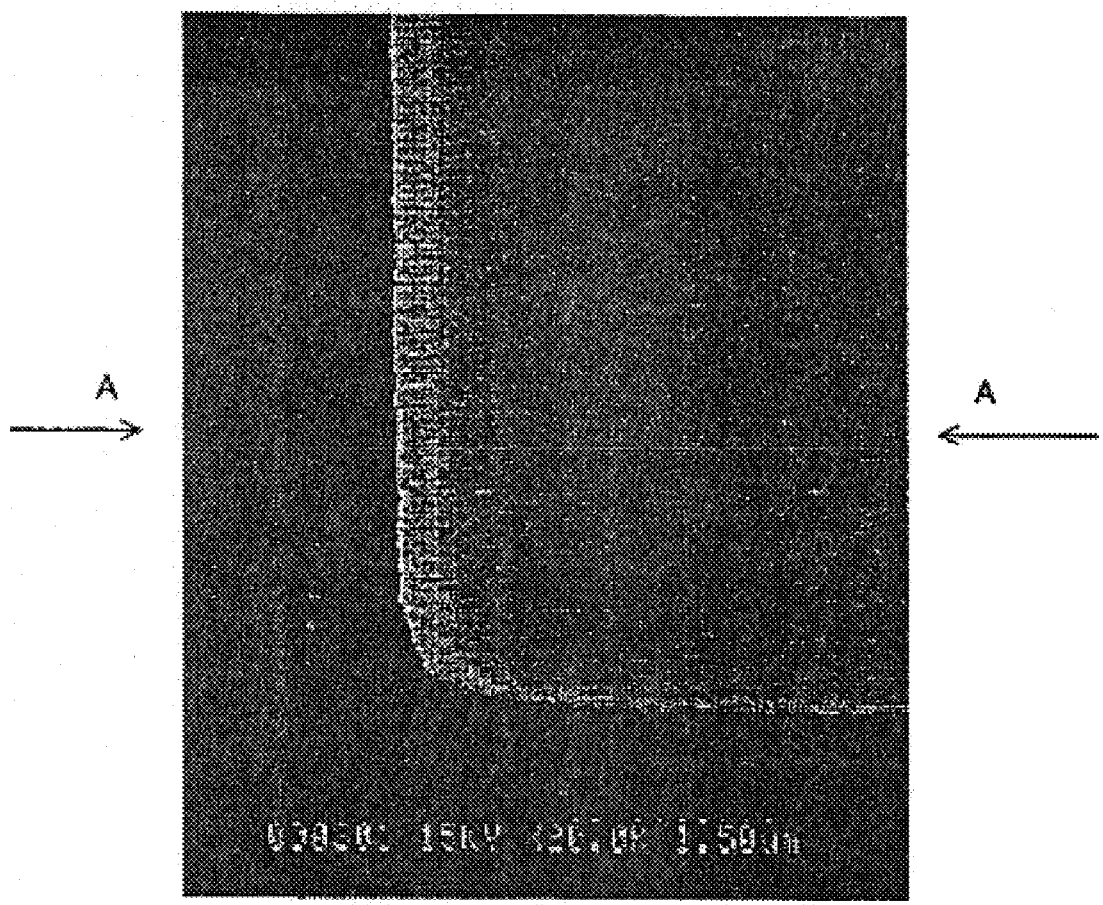
FIG. 9 is an electron microscope photograph showing a wiring shape in the case of performing etching without using the dummy conductive pattern.

FIG. 9 is an electron microscope photograph showing, for comparison, a shape of wiring obtained when etching is performed by use of the array substrate 10 for display, which has the same pattern as those shown in FIGS. 3 and 4, but without forming the dummy conductive patterns 29 at all. As shown in FIG. 9, large undercut occurs in the wiring since the molybdenum used for the upper conductive material 4 is passivated, and only the etching for the aluminum as the lower conductive material 3 progresses.

Figure 10:
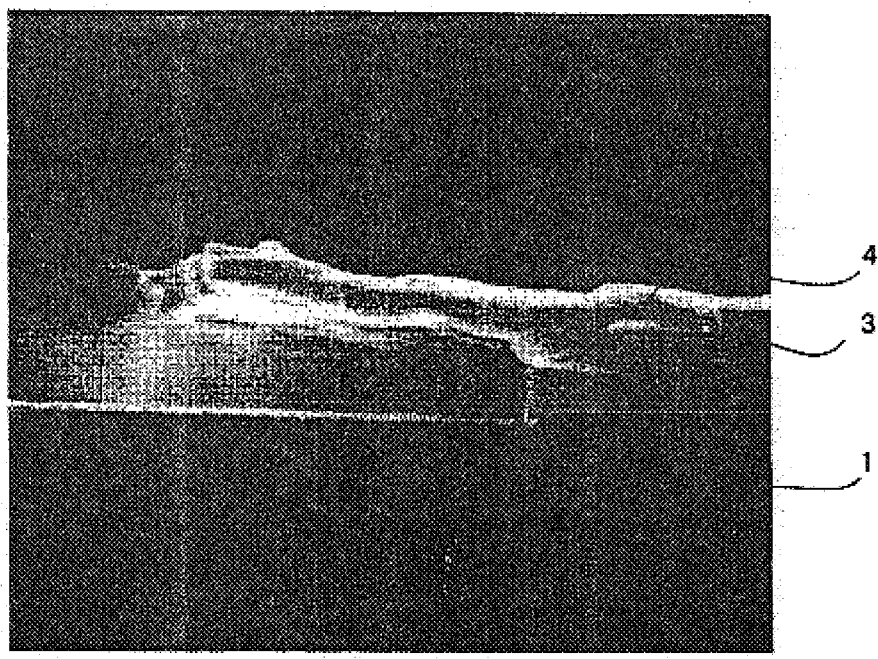
FIG. 10 is an electron microscope photograph showing a sectional shape of the wiring shape shown in FIG. 9.

FIG. 10 is an electron microscope photograph showing a cross section taken along a cutting plane line A—A of the wiring shown in FIG. 9. As shown in FIG. 10, the etching for the aluminum used for the lower conductive material 3 progresses more than that for the molybdenum used for the upper conductive material 4, resulting in the occurrence of the great undercut.

The present invention can be applied not only to the thin film transistor of a reverse stagger type as described above but also to a thin film transistor of a top gate type including wiring formed of aluminum and any metal other than the aluminum, of which passivating current density is known.

Moreover, although the array device for display of the present invention can be applied to a liquid crystal display device using a transparent insulating substrate made of such as glass, the array device for display of the present invention can be also used as an organic or inorganic electroluminescence device, wherein an untransparent insulating substrate is used and an array for display is formed on the insulating substrate.

As described above, according to the present invention, it is made possible to provide an array substrate for display, a method of manufacturing an array substrate for display and a display device using the array substrate for display, which are capable of being etched at a sufficiently high etching rate and a sufficient selection ratio, and eliminating the under cut and the lowering of a yield in manufacturing due to the inconvenience such as an interlayer short circuit. Moreover, according to the present invention, it is made possible to provide an array substrate for display, a method of manufacturing an array substrate for display and a display device using the array substrate for display, which are capable of providing a large-sized and high-resolution display device.

Although the preferred embodiments of the present invention have been described in detail, it should be understood that various changes, substitutions and alternations can be made therein without departing from spirit and scope of the inventions as defined by the appended claims.

What is claimed is:

1. An array substrate for display, comprising:
a layer of an insulating substrate, having an area;
a thin film transistor array formed on the insulating substrate;
a plurality of wiring arranged on the insulating substrate, each wiring having a first end, the wiring in communication with at least one of the transistors in the thin film array;
connections pads, each connection pad contacting the first end of at most one of the plurality of wirings;
pixel electrodes, and
dummy conductive patterns, the dummy patterns comprising at least about 30% of the area of the insulating substrate, the dummy conductive patterns situated between the connection pads and the pixel electrodes such that the dummy patters are not in contact with any of the wiring.

2. The array substrate for display according to claim 1 wherein at least one of the wirings comprises at least an upper layer and a lower layer of conductive materials.

3. The array substrate for display according to claim 2 wherein the lower layer wiring material is selected from the group consisting of aluminum and aluminum alloys.

4. The array substrate for display according to claim 2 wherein the upper layer wiring material is selected from the group consisting of molybdenum, chromium, tantalum, titanium and alloys thereof.

5. The array substrate for display according to claim 3 wherein the upper layer wiring material is selected from the group consisting of molybdenum, chromium, tantalum, titanium and alloys thereof.

6. The array substrate for display according to claim 5 wherein the upper wiring material is selected from the group consisting of molybdenum and alloys thereof.

7. The array substrate for display according to claim 4 wherein the upper layer wiring material is selected such that the upper layer wiring material does not become insoluble in an acid or alkaline etchant.

8. The array substrate for display according to claim 5 wherein the upper layer wiring material is selected such that the upper layer wiring material does not become insoluble in an acid or alkaline etchant.

9. A meted for forming an array substrate for display, comprising:
forming a layer of an insulating substrate, having an area;
forming a thin film transistor array formed on the insulating substrate, each wiring having a first end, the wiring in communication with at least on of the transistors in the thin film array;
forming connections pads, each connection pad contacting the first end of at most one of the plurality of wirings;
forming pixel electrodes, and
forming dummy conductive patterns, the dummy conductive patterns comprising at least about 30% of the area of the insulating substrate, the dummy patterns situated between the connection pads and the pixel electrodes such that the dummy patters are not in contact with any of the wiring.

10. The method for forming an array substrate for display according to claim 9 wherein at least one of the wirings comprises at least an upper layer and a lower layer of conductive materials.

11. The method for forming an array substrate for display according to claim 10 wherein the lower layer wiring materials is selected from the group consisting of aluminum and aluminum alloys.

12. The method for forming an array substrate for display according to claim 10 wherein the upper layer wiring material is selected from the group consisting of molybdenum, chromium, tantalum, titanium and alloys thereof.

13. The method for forming an array substrate for display according to claim 11 wherein the upper layer wiring material is selected from the group consisting of molybdenum, chromium, tantalum, titanium and allays thereof.

14. The method for forming an array substrate for display according to claim 13 wherein the upper wiring material is selected from the group consisting of molybdenum and alloys thereof.

15. The method for forming an array substrate for display according to claim 12 wherein the upper layer wiring material is selected such that the upper layer wiring material does not become insoluble in an acid or alkaline etchant.

16. The method for forming an array substrate for display according to claim 13 wherein the upper layer wiring material is selected such that the upper layer wiring material does not become insoluble in an acid or alkaline etchant.

* * * * *

(12) EX PARTE REEXAMINATION CERTIFICATE (10404th)

United States Patent
Tsujimura et al.

(10) Number: US 6,689,629 C1
(45) Certificate Issued: Nov. 14, 2014

(54) ARRAY SUBSTRATE FOR DISPLAY, METHOD OF MANUFACTURING ARRAY SUBSTRATE FOR DISPLAY AND DISPLAY DEVICE USING THE ARRAY SUBSTRATE

(75) Inventors: Takatoshi Tsujimura, Fujisawa (JP); Atsuya Makita, Sagamihara (JP); Toshiaki Arai, Yokohama (JP)

(73) Assignee: AU Optronics Corporation

Reexamination Request:
No. 90/009,697, Mar. 16, 2010

Reexamination Certificate for:
Patent No.: 6,689,629
Issued: Feb. 10, 2004
Appl. No.: 10/068,500
Filed: Feb. 5, 2002

(30) Foreign Application Priority Data

Feb. 6, 2001 (JP) .................................. 2001-029587

(51) Int. Cl.
*H01L 21/00* (2006.01)

(52) U.S. Cl.
USPC .................. 438/25; 438/149; 438/73; 257/72; 257/748

(58) Field of Classification Search
None
See application file for complete search history.

(56) References Cited

To view the complete listing of prior art documents cited during the proceeding for Reexamination Control Number 90/009,697, please refer to the USPTO's public Patent Application Information Retrieval (PAIR) system under the Display References tab.

*Primary Examiner* — Tuan H Nguyen

(57) ABSTRACT

Disclosed is to provide an array substrate for display, a method of manufacturing the array substrate for display and a display device using the array substrate for display.
The present invention is an array substrate for display, which includes: a thin film transistor array formed on an insulating substrate 1; a plurality of wirings 23 and 24 arranged on the insulating substrate 1; connection pads 25 and 27 arranged on unilateral ends of the wirings 23 and 24 and respectively connected therewith; and pixel electrodes 22, wherein dummy conductive patterns 29 are arranged between the ends of the connection pads 25 and 27 and ends of the pixel electrodes 22.

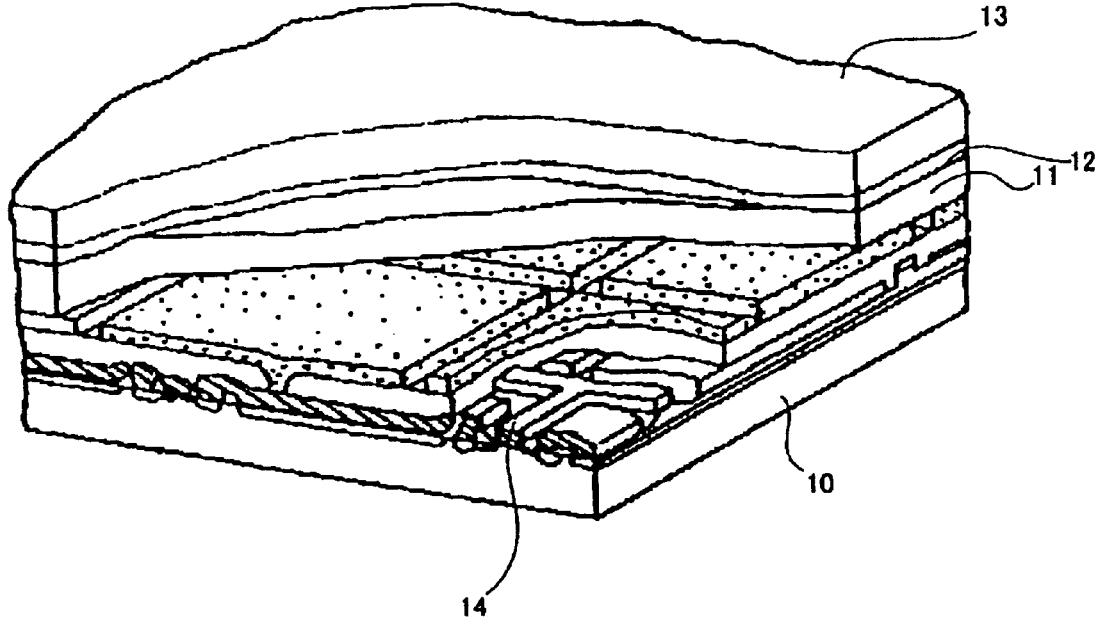

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 4, 10, 12 and 13 are cancelled.

Claims 1, 3, 7, 9, 11 and 14-16 are determined to be patentable as amended.

Claims 5, 6 and 8, dependent on an amended claim, are determined to be patentable.

New claim 17 is added and determined to be patentable.

1. An array substrate for display, comprising:
[a layer of] an insulating substrate[, having an area];
a thin film transistor array [formed] on the insulating substrate;
a plurality of [wiring arranged] wirings on the insulating substrate, each wiring having a first end, [the] *each* wiring in communication with at least one [of the transistors] *transistor* in the thin film *transistor* array, *and at least one of the wirings comprising at least an upper layer and a lower layer of conductive materials, wherein the upper layer wiring material is selected from the group consisting of molybdenum, chromium, tantalum, titanium and alloys thereof*;
*a plurality of* connections pads, each connection pad contacting the first end of at most one of the plurality of wirings;
*a plurality of* pixel electrodes[,]; and
*a plurality of* dummy conductive patterns *on the insulating substrate, wherein the plurality of* dummy conductive patterns [comprising] *comprises* at least about 30% of [the] *an* area of the insulating substrate[, the dummy conductive patterns situated] between the connection pads and the pixel electrodes [such that], *and* the dummy [patters] *conductive patterns* are not in contact with any of the [wiring] *wirings*.

3. The array substrate for display according to claim [2] *1* wherein the lower layer wiring material is selected from the group consisting of aluminum and aluminum alloys.

7. The array substrate for display according to claim [4] *1* wherein the upper layer wiring material is selected such that the upper layer wiring material does not become insoluble in an acid or alkaline etchant.

9. A [meted] *method* for forming an array substrate for display, comprising:
forming a layer of an insulating substrate[, having an area];
forming a thin film transistor array [formed] *on the insulating substrate;*
*forming a plurality of wirings* on the insulating substrate, each wiring having a first end, [the] *each* wiring in communication with at least [on of the transistors] *one transistor* in the thin film *transistor* array, *wherein at least one of the wirings comprises at least an upper layer and a lower layer of conductive materials, and the upper layer wiring material is selected from the group consisting of molybdenum, chromium, tantalum, titanium and alloys thereof;*
forming *a plurality of* connections pads, each connection pad contacting the first end of at most one of the plurality of wirings;
forming *a plurality of* pixel electrodes[,]; and
forming *a plurality of* dummy conductive patterns *on the insulating substrate, wherein the plurality of* dummy conductive patterns [comprising] *comprises* at least about 30% of [the] *an* area of the insulating substrate[, the dummy patterns situated] between the connection pads and the pixel electrodes [such that], *and* the dummy [patters] *conductive patterns* are not in contact with any of the [wiring] *wirings*.

11. The method for forming an array substrate for display according to claim [10] *9* wherein the lower layer wiring materials is selected from the group consisting of aluminum and aluminum alloys.

14. The method for forming an array substrate for display according to claim [13] *9* wherein the upper wiring material is selected from the group consisting of molybdenum and alloys thereof.

15. The method for forming an array substrate for display according to claim [12] *9* wherein the upper layer wiring material is selected such that the upper layer wiring material does not become insoluble in an acid or alkaline etchant.

16. The method for forming an array substrate for display according to claim [13] *9* wherein the upper layer wiring material is selected such that the upper layer wiring material does not become insoluble in an acid or alkaline etchant.

*17. An array substrate for display, comprising:*
*an insulating substrate;*
*an array of thin film transistors on the insulating substrate;*
*a plurality of wirings on the insulating substrate, each wiring having a first end, and each wiring directly connecting with at least one thin film transistor in the array;*
*a plurality of connections pads, each connection pad contacting the first end of at most one of the plurality of wiring*
*a plurality of pixel electrodes; and*
*a plurality of dummy conductive patterns on the insulating substrate, wherein the plurality of dummy conductive patterns comprises at least about 30% of an area of the insulating substrate between the connection pads and the pixel electrodes.*

* * * * *